US009416338B2

(12) United States Patent
Cooper et al.

(10) Patent No.: US 9,416,338 B2
(45) Date of Patent: Aug. 16, 2016

(54) COMPOSITION FOR AND METHOD OF SUPPRESSING TITANIUM NITRIDE CORROSION

(75) Inventors: Emanuel I. Cooper, Scarsdale, NY (US); George Gabriel Totir, Yorktown Heights, NY (US); Makonnen Payne, San Jose, CA (US)

(73) Assignees: ADVANCED TECHNOLOGY MATERIALS, INC., Danbury, CT (US); INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 13/878,684

(22) PCT Filed: Oct. 13, 2011

(86) PCT No.: PCT/US2011/056084
§ 371 (c)(1),
(2), (4) Date: Jul. 9, 2013

(87) PCT Pub. No.: WO2012/051380
PCT Pub. Date: Apr. 19, 2012

(65) Prior Publication Data
US 2013/0303420 A1 Nov. 14, 2013

Related U.S. Application Data

(60) Provisional application No. 61/392,772, filed on Oct. 13, 2010.

(51) Int. Cl.
| | |
|---|---|
| C11D 3/30 | (2006.01) |
| C11D 9/16 | (2006.01) |
| C11D 3/00 | (2006.01) |
| C11D 3/04 | (2006.01) |
| C11D 3/26 | (2006.01) |
| C11D 3/39 | (2006.01) |
| C11D 11/00 | (2006.01) |
| H01L 21/02 | (2006.01) |
| H01L 21/768 | (2006.01) |
| G03F 7/42 | (2006.01) |

(52) U.S. Cl.
CPC .............. *C11D 3/0073* (2013.01); *C11D 3/046* (2013.01); *C11D 3/26* (2013.01); *C11D 3/3942* (2013.01); *C11D 3/3947* (2013.01); *C11D 11/0047* (2013.01); *G03F 7/423* (2013.01); *G03F 7/425* (2013.01); *H01L 21/02063* (2013.01); *H01L 21/02074* (2013.01); *H01L 21/76814* (2013.01)

(58) Field of Classification Search
CPC ........ C11D 3/046; C11D 3/30; C11D 3/3955; C11D 3/3956; C11D 7/3209; C11D 9/16; C11D 11/0023; C11D 11/0047; H01L 21/76814
See application file for complete search history.

(56) References Cited

U.S. PATENT DOCUMENTS

| | | | | |
|---|---|---|---|---|
| 4,509,992 | A | * | 4/1985 | Higgins ................... 148/252 |
| 4,586,961 | A | * | 5/1986 | Bradley et al. ............. 134/2 |
| 5,006,125 | A | * | 4/1991 | Patton et al. .............. 8/188 |
| 5,320,709 | A | | 6/1994 | Bowden et al. |
| 5,993,685 | A | | 11/1999 | Currie et al. |
| 6,306,807 | B1 | | 10/2001 | Wojtczak et al. |
| 6,395,194 | B1 | | 5/2002 | Russell et al. |
| 6,692,546 | B2 | | 2/2004 | Ma et al. |
| 6,735,978 | B1 | | 5/2004 | Tom et al. |
| 6,773,873 | B2 | | 8/2004 | Seijo et al. |
| 6,800,218 | B2 | | 10/2004 | Ma et al. |
| 6,802,983 | B2 | | 10/2004 | Mullee et al. |
| 6,849,200 | B2 | | 2/2005 | Baum et al. |
| 6,875,733 | B1 | | 4/2005 | Wojtczak et al. |
| 6,943,139 | B2 | | 9/2005 | Korzenski et al. |
| 6,989,358 | B2 | | 1/2006 | Korzenski et al. |
| 7,001,253 | B2 | * | 2/2006 | Zhou et al. ................ 451/41 |
| 7,011,716 | B2 | | 3/2006 | Xu et al. |
| 7,029,373 | B2 | | 4/2006 | Ma et al. |
| 7,030,168 | B2 | | 4/2006 | Xu et al. |
| 7,119,052 | B2 | | 10/2006 | Korzenski et al. |
| 7,119,418 | B2 | | 10/2006 | Xu et al. |
| 7,223,352 | B2 | | 5/2007 | Korzenski et al. |
| 7,300,601 | B2 | | 11/2007 | Liu et al. |
| 7,326,673 | B2 | | 2/2008 | Xu et al. |
| 7,435,162 | B2 | * | 10/2008 | Kollodge ................... 451/41 |

(Continued)

FOREIGN PATENT DOCUMENTS

| | | | |
|---|---|---|---|
| WO | 2006/110645 | A2 | 10/2006 |
| WO | 2006/138505 | A1 | 12/2006 |
| WO | 2007/027522 | A2 | 3/2007 |
| WO | 2010/017160 | A2 | 2/2010 |
| WO | 2010/086745 | A1 | 8/2010 |
| WO | 2010/091045 | A2 | 8/2010 |

OTHER PUBLICATIONS

International Search Report, May 29, 2012.

*Primary Examiner* — Charles Boyer
(74) *Attorney, Agent, or Firm* — Tristan A. Fuierer; Moore & Van Allen, PLLC; Rosa Yaghmour (57) ABSTRACT

Cleaning compositions and processes for cleaning residue from a microelectronic device having said residue thereon. The composition comprises at least one amine, at least one oxidizing agent, water, and at least one borate species and achieves highly efficacious cleaning of the residue material, including post-ash residue, post-etch residue, post-CMP residue, particles, organic contaminants, metal ion contaminants, and combinations thereof from the microelectronic device while simultaneously not damaging the titanium nitride layers and low-k dielectric materials also present on the device.

17 Claims, 2 Drawing Sheets

(56) References Cited

U.S. PATENT DOCUMENTS

| | | | |
|---|---|---|---|
| 7,534,752 B2 | 5/2009 | Wojtczak et al. | |
| 7,553,803 B2 | 6/2009 | Korzenski et al. | |
| 7,557,073 B2 | 7/2009 | Korzenski et al. | |
| 7,736,405 B2 | 6/2010 | Darsillo et al. | |
| 7,888,301 B2 | 2/2011 | Bernhard et al. | |
| 7,922,824 B2 | 4/2011 | Minsek et al. | |
| 7,960,328 B2 | 6/2011 | Visintin et al. | |
| 8,114,220 B2 | 2/2012 | Visintin et al. | |
| 8,236,485 B2 | 8/2012 | Minsek et al. | |
| 8,304,344 B2 | 11/2012 | Boggs et al. | |
| 8,338,087 B2 | 12/2012 | Rath et al. | |
| 2002/0028756 A1* | 3/2002 | Carter et al. | 510/446 |
| 2002/0043026 A1* | 4/2002 | Luo et al. | 51/304 |
| 2003/0077985 A1* | 4/2003 | Zhou et al. | 451/41 |
| 2003/0079416 A1* | 5/2003 | Ma et al. | 51/307 |
| 2005/0118813 A1 | 6/2005 | Korzenski et al. | |
| 2005/0118832 A1 | 6/2005 | Korzenski et al. | |
| 2005/0176604 A1 | 8/2005 | Lee et al. | |
| 2005/0227482 A1 | 10/2005 | Korzenski et al. | |
| 2006/0014391 A1 | 1/2006 | Lee et al. | |
| 2006/0249482 A1* | 11/2006 | Wrschka et al. | 216/88 |
| 2007/0218692 A1* | 9/2007 | Wolk et al. | 438/692 |
| 2008/0125342 A1 | 5/2008 | Visintin et al. | |
| 2009/0120457 A1* | 5/2009 | Naghshineh et al. | 134/2 |
| 2009/0133716 A1 | 5/2009 | Lee | |
| 2009/0200234 A1 | 8/2009 | Schacht et al. | |
| 2009/0212021 A1 | 8/2009 | Bernhard et al. | |
| 2009/0215269 A1 | 8/2009 | Boggs et al. | |
| 2009/0239777 A1 | 9/2009 | Angst et al. | |
| 2009/0301996 A1 | 12/2009 | Visintin et al. | |
| 2010/0056410 A1 | 3/2010 | Visintin et al. | |
| 2010/0065530 A1 | 3/2010 | Walker et al. | |
| 2010/0087065 A1 | 4/2010 | Boggs et al. | |
| 2010/0112728 A1 | 5/2010 | Korzenski et al. | |
| 2010/0163788 A1 | 7/2010 | Visintin et al. | |
| 2010/0176082 A1 | 7/2010 | Cooper et al. | |
| 2010/0261632 A1 | 10/2010 | Korzenski et al. | |
| 2010/0286014 A1 | 11/2010 | Barnes | |
| 2011/0039747 A1 | 2/2011 | Zhou et al. | |
| 2011/0117751 A1 | 5/2011 | Sonthalia et al. | |

* cited by examiner

COMPOSITION FOR AND METHOD OF SUPPRESSING TITANIUM NITRIDE CORROSION

CROSS-REFERENCE TO RELATED APPLICATIONS

This application is filed under the provisions of 35 U.S.C. §371 and claims the priority of International Patent Application No. PCT/US2011/056084 filed on 13 Oct. 2011 entitled "COMPOSITION FOR AND METHOD OF SUPPRESSING TITANIUM NITRIDE CORROSION" in the name of Emanuel I. Cooper, et al, which claims priority to U.S. Provisional Patent Application No. 61/392,772, filed on 13 Oct. 2010, both of which are hereby incorporated by reference herein in their entirety.

FIELD

The present invention relates to compositions for the removal of residue from surfaces, preferably titanium nitride-containing surfaces, and methods of making and using the same.

DESCRIPTION OF THE RELATED ART

The cleaning of integrated circuit (IC) substrates, such as silicon wafers, with metal-free alkaline solutions to remove organic and metal contamination is widely practiced. One commonly used alkaline solution of this type is known as SC-1 or RCA-1, which comprises an aqueous mixture of ammonium hydroxide, hydrogen peroxide, and water (e.g., 1:1:5 of 30% $H_2O_2$, 28% $NH_4OH$ and $H_2O$). Various cleaning tasks can be accomplished with SC-1, among these, the cleaning of silicon wafers immediately after their fabrication, the cleaning of such wafers immediately prior to gate oxide growth, the removal of oxide etch residues later in the IC processing sequence, and selective etching and resist particulate removal. The purpose of the hydrogen peroxide is to protect the silicon metal from exposure to strong acids or bases by continuously forming a protective oxide layer in order to prevent etching or roughening of the silicon surface. Disadvantageously, hydrogen peroxide may corrode a metal on the surface of the substrate due to the metal reacting with oxygen of the hydrogen peroxide.

Titanium nitride (TiN) films are becoming a widely used component of metal gate structures, especially at the 32 nm node and beyond. While TiN is relatively corrosion-resistant (e.g., to moderately acidic solutions), the typical front-end-of-the-line (FEOL) cleaning processes expose TiN to peroxide-containing solutions (e.g., SC-1) which vigorously attack TiN, even at room temperature. The incompatibility of SC-1 with TiN has become a crisis for the microelectronics industry because SC-1 is used repeatedly throughout the FEOL processes to remove residue (e.g., particles and organic and metal ion contaminants), It is therefore an object of the present invention to provide improved compositions for the effective removal of residue from IC substrates and other microelectronic devices, said compositions being compatible with metal gate materials such as titanium nitride.

SUMMARY OF THE INVENTION

The present invention generally relates to cleaning compositions and methods of making and using same. One aspect of the invention relates to a composition and process for cleaning residue from microelectronic devices having said residue thereon, while simultaneously not compromising the titanium nitride materials present on the microelectronic device surface.

In one aspect, a cleaning composition comprising, consisting of, or consisting essentially of at least one amine, at least one oxidizing agent, water, and at least one borate species is described, wherein said cleaning composition is suitable for cleaning residue from a microelectronic device having said residue thereon. Preferably, the at least one borate compound comprises a monoborate, diborate, triborate, tetraborate, pentaborate, hexaborate, or perborate anion. Even more preferably, the at least one borate compound comprises an ammonium cation. Most preferably, the at least one borate compound comprises ammonium tetraborate tetrahydrate. In one embodiment, the at least one borate is generated in situ.

In another aspect, a cleaning composition comprising, consisting of, or consisting essentially of ammonia, at least one oxidizing agent, water, and at least one borate species is described, wherein said cleaning composition is suitable for cleaning residue from a microelectronic device having said residue thereon. Preferably, the at least one borate compound comprises a monoborate, diborate, triborate, tetraborate, pentaborate, hexaborate, or perborate anion. Even more preferably, the at least one borate compound comprises an ammonium cation. Most preferably, the at least one borate compound comprises ammonium tetraborate tetrahydrate. In one embodiment, the at least one borate is generated in situ.

In still another aspect, a cleaning composition comprising, consisting of, or consisting essentially of at least one amine, hydrogen peroxide, water, and at least one borate species is described, wherein said cleaning composition is suitable for cleaning residue from a microelectronic device having said residue thereon. Preferably, the at least one borate compound comprises a monoborate, diborate, triborate, tetraborate, pentaborate, hexaborate, or perborate anion. Even more preferably, the at least one borate compound comprises an ammonium cation. Most preferably, the at least one borate compound comprises ammonium tetraborate tetrahydrate. In one embodiment, the at least one borate is generated in situ.

In yet another aspect, a cleaning composition comprising, consisting of, or consisting essentially of ammonia, hydrogen peroxide, water, and at least one borate species is described, wherein said cleaning composition is suitable for cleaning residue from a microelectronic device having said residue thereon. Preferably, the at least one borate compound comprises a monoborate, diborate, triborate, tetraborate, pentaborate, hexaborate, or perborate anion. Even more preferably, the at least one borate compound comprises an ammonium cation. Most preferably, the at least one borate compound comprises ammonium tetraborate tetrahydrate. In one embodiment, the at least one borate is generated in situ.

In still another embodiment, a kit is described, said kit comprising, in one or more containers, one or more of the following reagents for forming a cleaning composition, said one or more reagents selected from the group consisting of at least one amine, at least one oxidizing agent, water, and at least one borate species, and wherein the kit is adapted to form a cleaning composition suitable for cleaning residue from a microelectronic device having said residue thereon.

In another embodiment, a method of removing material from a microelectronic device having said material thereon is described, said method comprising contacting the microelectronic device with a cleaning composition for sufficient time to at least partially remove said material from the microelectronic device, wherein the cleaning composition includes at least one amine, at least one oxidizing agent, water, and at least one borate species. The material comprises residue selected from the group consisting of post-ash residue, post-etch residue, post-CMP residue, particles, organic contaminants, metal ion contaminants, and combinations thereof. Preferably, the at least one borate compound comprises a monoborate, diborate, triborate, tetraborate, pentaborate, hexaborate, or perborate anion. Even more preferably, the at least one borate compound comprises an ammonium cation. Most preferably, the at least one borate compound comprises ammonium tetraborate tetrahydrate. In one embodiment, the at least one borate is generated in situ.

Other aspects, features and advantages of the invention will be more fully apparent from the ensuing disclosure and appended claims.

DETAILED DESCRIPTION OF THE INVENTION, AND PREFERRED EMBODIMENTS THEREOF

The present invention generally relates to compositions for removing residue, preferably particles and organic and metal ion contaminants, from microelectronic devices having said residue thereon, said compositions preferably being compatible with titanium nitride, tantalum nitride, and low-k dielectric materials on the microelectronic device surface.

For ease of reference, "microelectronic device" corresponds to semiconductor substrates, flat panel displays, phase change memory devices, solar panels and other products including solar cell devices, photovoltaics, and microelectromechanical systems (MEMS), manufactured for use in microelectronic, integrated circuit, energy collection, or computer chip applications. It is to be understood that the terms "microelectronic device," "microelectronic substrate" and "microelectronic device structure" are not meant to be limiting in any way and include any substrate or structure that will eventually become a microelectronic device or microelectronic assembly. The microelectronic device can be patterned, blanketed, a control and/or a test device.

As defined herein, "residue" corresponds to post-etch residue, post-ash residue, post-CMP residue, particles, organic contaminants, metal ion contaminants, and combinations thereof.

As defined herein, "particles" correspond to CMP abrasives, materials that redeposit such as photoresist or bevel debris (e.g., dielectric material which can delaminate and reattach at the working surface), etch residues, materials shed from tooling such as debris from the implanter or RIE tools, environmental dust, etc.

As defined herein, "organic contaminants" correspond to materials left behind by various processes such as photoresist scum, etch polymer, inhibitors, and surfactants; or environmental contaminants such as skin oils and debris from equipment such as lubricants and CMP pad debris.

As defined herein, "metal ion contaminants" correspond to metal ions either left behind as residue in a subtractive process such as a metal etch or CMP, or result from processes such as etching. Metal ion contaminants include, but are not limited to, sodium, potassium, iron, cerium, and combinations thereof.

"Post-etch residue" and "post-plasma etch residue," as used herein, corresponds to material remaining following gas-phase plasma etching processes, e.g., BEOL dual-damascene processing. The post-etch residue may be organic, organometallic, organosilicic, or inorganic in nature, for example, silicon-containing material, titanium-containing material, nitrogen-containing material, oxygen-containing material, polymeric residue material, copper-containing residue material (including copper oxide residue), tungsten-containing residue material, cobalt-containing residue material, etch gas residue such as chlorine and fluorine, and combinations thereof.

It is well known to the skilled artisan that the combination of ammonia and water is equivalent to ammonium hydroxide.

As defined herein, "low-k dielectric material" and ULK corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. Most preferably, the low-k dielectric material is deposited using organosilane and/or organosiloxane precursors. It is to be appreciated that the low-k dielectric materials may have varying densities and varying porosities.

As defined herein, "post-ash residue," as used herein, corresponds to material remaining following oxidative or reductive plasma ashing to remove hardened photoresist and/or bottom anti-reflective coating (BARC) materials. The post-ash residue may be organic, organometallic, organosilicic, or inorganic in nature.

As defined herein, "post-CMP residue" corresponds to particles from the polishing slurry, e.g., silica-containing particles, chemicals present in the slurry, reaction by-products of the polishing slurry, carbon-rich particles, polishing pad particles, brush deloading particles, equipment materials of construction particles, copper, copper oxides, copper-containing materials, aluminum, aluminum oxides, aluminum-containing materials, organic residues, and any other materials that are the by-products of the CMP process.

As defined herein, "amine" species include at least one primary, secondary, or tertiary amine, ammonia, and/or quaternary ammonium hydroxide compound (e.g., alkylammonium hydroxide, alkylarylammonium hydroxide, etc.), with the proviso that (i) species including both a carboxylic acid group and an amine group, (ii) surfactants that include amine groups, and (iii) species where the amine group is a substituent (e.g., attached to an aryl or heterocyclic moiety) are not considered "amines" according to this definition. Amines for the purposes of this invention include, but are not limited to: aliphatic primary, secondary, or tertiary amines; 4, 6, 7, 8, 9 or 10-membered saturated or unsaturated amine rings; alkylammonium hydroxide compounds having the general formula $R_1R_2R_3R_4NOH$ where $R_1$, $R_2$, $R_3$ and $R_4$ are the same as or different from one another and are hydrogen and $C_1$-$C_6$ alkyl groups (e.g., methyl, ethyl, propyl, butyl, pentyl or hexyl); alkylarylammonium hydroxide compounds have the general formula $R_1R_2R_3R_4NOH$ where $R_1$, $R_2$, $R_3$ and $R_4$ are the same as or different from one another and are hydrogen, $C_1$-$C_6$ alkyl groups (e.g., methyl, ethyl, propyl, butyl, pentyl or hexyl) and substituted or unsubstituted $C_6$-$C_{10}$ aryl groups (e.g., benzyl); and alkanolamines.

It is understood by the skilled artisan that ammonia and ammonium hydroxide are the same species in an aqueous solution.

As defined herein, the "borates" include monoborates, diborates, polyborates, triborates, tetraborates, pentaborates and hexaborates. For the purpose of this disclosure, perborates (also referred to as peroxoborates, see, Cotton and Wilkinson, *Advanced Inorganic Chemistry*, Fifth edition, 1988), are also considered "borates."

It is understood by the skilled artisan that titanium nitride is not always stoichiometric. In other words, titanium nitride can be nitrogen rich or nitrogen poor. Accordingly, titanium nitride will be represented as $TiN_x$ herein. Although not disclosed throughout the application, titanium silicon nitride, tantalum nitride and tantalum silicon nitride are all interchangeable with titanium nitride for the purposes of the invention described herein.

As used herein, "about" is intended to correspond to ±5% of the stated value.

As used herein, "suitability" for cleaning residue from a microelectronic device having said residue thereon corresponds to at least partial removal of said residue from the microelectronic device. Preferably, at least about 90 wt % of one or more of the materials, more preferably at least 95 wt % of one or more of the materials, and most preferably at least 99 wt % of one or more of the materials to be removed are removed from the microelectronic device. "Compatibility" with titanium nitride and low-k dielectric material is defined as the removal of no more than 5 wt %, more preferably no more than 3 wt %, and most preferably no more than 1 wt % titanium nitride and low-k dielectric from the microelectronic device.

"Substantially devoid" is defined herein as less than 2 wt %, preferably less than 1 wt %, more preferably less than 0.5 wt %, and most preferably less than 0.1 wt %.

Compositions of the invention may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed.

The present inventors discovered a cleaning composition that suitably removes residue, particles, and organic and metal ion contaminants from the surface of a microelectronic device having same thereon while being compatible with titanium nitride layers and low-k dielectric materials.

In a first aspect, the cleaning compositions described herein are variations of SC-1 and are suitable for removing residues, particles, and organic and metal ion contaminants from the surface of a microelectronic device having same thereon. Advantageously, the cleaning compositions are compatible with titanium nitride layers and low-k dielectric materials. In one embodiment, the cleaning compositions include at least one amine, at least one oxidizing agent, water, and at least one borate species. In another embodiment, the cleaning compositions include at least one amine, hydrogen peroxide, water, and at least one borate species. In still another embodiment, the cleaning compositions include ammonia, at least one oxidizing agent, water, and at least one borate species. In yet another embodiment, the cleaning compositions include ammonia, hydrogen peroxide, water, and at least one borate species.

In the broad practice, the cleaning composition may comprise, consist of, or consist essentially of: (i) at least one amine, at least one oxidizing agent, water, and at least one borate species; (ii) at least one amine, hydrogen peroxide, water, and at least one borate species; (iii) ammonia, at least one oxidizing agent, water, and at least one borate species; or (iv) ammonia, hydrogen peroxide, water, and at least one borate species.

The water is included to serve as a solvent and assist in the dissolution of residues. The water is preferably deionized.

In a preferred embodiment, the cleaning composition is substantially devoid of compounds having amidoxime functional groups. In another preferred embodiment, the cleaning composition is substantially devoid of abrasive material prior to contact with the substrate to be cleaned. In yet another preferred embodiment, the cleaning composition is substantially devoid of organic solvents such as N-methylpyrrolidone. In addition, the compositions of the invention should not be capable of polymerizing to form a resist or other polymeric material. It should be understood that the composition may be substantially devoid of any combination of compounds having amidoxime functional groups, abrasive material prior to contact with the substrate to be cleaned, organic solvents, and combinations thereof.

Standard clean 1 (SC-1) typically includes ammonia, hydrogen peroxide and water in varying ratios. For example, a conventional SC-1 solution includes 1 part 29 wt % $NH_3$:1 part 30 wt % $H_2O_2$:5 parts water. For the purposes of this invention, the SC-1 solution may include amines other than or in addition to ammonia and the solution may include oxidizing agents other than or in addition to hydrogen peroxide. Further, the ratio of parts of amine or ammonia to oxidizing agent or $H_2O_2$ can be in a range from about 10:1 to about 1:10 while the ratio of parts of amine or ammonia to water can be in a range from about 1:10 to about 1:100. The amount of the at least one borate compound added is in a range from about 0.01 wt % to about 10 wt %, preferably about 0.5 wt % to about 5 wt %, and most preferably about 1 wt % to about 4 wt %.

The pH range of the aqueous cleaning composition is about 8 to about 13, preferably about 9 to about 12, even more preferably about 9 to about 11.

The amines may include straight-chained or branched $C_1$-$C_{20}$ alkylamines, substituted or unsubstituted $C_6$-$C_{10}$ arylamines, glycolamines, alkanolamines, and amine-N-oxides including, but not limited to, pyridine; 2-ethylpyridine; 2-methoxypyridine and derivatives thereof such as 3-methoxypyridine; 2-picoline; dimethylpyridine; piperidine; piperazine; triethylamine; triethanolamine; amino ethylethanolamine; choline; N-methylamino ethanol; amino ethoxyethanol; dimethylaminoethoxyethanol; diethanolamine; N-methyldiethanolamine; ethylamine; methylamine; isobutylamine; Benzylamine; tert-butylamine; tributylamine; dipropylamine; dimethylamine; diglycolamine; monoethanolamine; pyrrole; isoxazole; 1,2,4-triazole; bipyridine; pyrimidine; pyrazine; pyridazine; quinoline; isoquinoline; indole; imidazole; N-methylmorpholine-N-oxide (NMMO); trimethylamine-N-oxide; triethylamine-N-oxide; pyridine-N-oxide; N-ethylmorpholine-N-oxide; N-methylpyrrolidine-N-oxide; N-ethylpyrrolidine-N-oxide; 1-methylimidazole; diisopropylamine; diisobutylamine; Dimethylamine; Ethanamine; Ethylamine; Ethylenediamine; 1-Hexanamine; 1,6-Hexanediamine; aniline; aniline derivatives; polyamines; and combinations thereof. Alternatively, or in addition, the amines can be alkylammonium hydroxide compounds having the general formula $R_1R_2R_3R_4NOH$ where $R_1$, $R_2$, $R_3$ and $R_4$ are the same as or different from one another and are hydrogen and $C_1$-$C_6$ alkyl groups (e.g., methyl, ethyl, propyl, butyl, pentyl or hexyl), alkylarylammonium hydroxide compounds having the general formula $R_1R_2R_3R_4NOH$ where $R_1$, $R_2$, $R_3$ and $R_4$ are the same as or different from one another and are selected from the group consisting of hydrogen, $C_1$-$C_6$ alkyl groups (e.g., methyl, ethyl, propyl, butyl, pentyl or hexyl) and substituted or unsubstituted $C_6$-$C_{10}$ aryl groups (e.g., benzyl), or combinations thereof, including, but not limited to, benzyltrimethylammonium hydroxide, benzyltriethylammonium hydroxide, benzyltributylammonium hydroxide, dimethyldiethylammonium hydroxide, tetramethylammonium hydroxide, tetraethylammonium hydroxide, tetrapropylammonium hydroxide, tetrabutylammonium hydroxide, ammonium hydroxide, and combinations thereof. Preferably, the amine compound comprises ammonium hydroxide (ammonia).

Oxidizing agents contemplated herein include, but are not limited to, hydrogen peroxide ($H_2O_2$), $FeCl_3$ (both hydrated and unhydrated), oxone ($2KHSO_5.KHSO_4.K_2SO_4$), ozonated water, ammonium peroxomonosulfate, ammonium chlorite ($NH_4ClO_2$), ammonium bromite ($NH_4ClO_2$), ammonium chlorate ($NH_4ClO_3$), ammonium bromate ($NH_4BrO_3$), ammonium iodate ($NH_4IO_3$), ammonium perborate ($NH_4BO_3$), ammonium perchlorate ($NH_4ClO_4$), ammonium perbromate ($NH_4BrO_4$), ammonium periodate ($NH_4IO_3$), ammonium persulfate (($NH_4)_2S_2O_8$), ammonium hypochlorite ($NH_4ClO$), ammonium hypobromite ($NH_4BrO$), sodium persulfate ($Na_2S_2O_8$), sodium hypochlorite (NaClO), sodium hypobromite (NaBrO), potassium iodate ($KIO_3$), potassium bromate ($KBrO_3$), potassium permanganate ($KMnO_4$), potassium persulfate, nitric acid ($HNO_3$), potassium persulfate ($K_2S_2O_8$), potassium hypochlorite (KClO), potassium hypobromite (KBrO), tetramethylammonium chlorite (($N(CH_3)_4)ClO_2$), tetramethylammonium bromite (($N(CH_3)_4)BrO_2$), tetramethylammonium chlorate (($N(CH_3)_4)ClO_3$), tetramethylammonium bromate (($N(CH_3)_4)BrO_3$), tetramethylammonium iodate (($N(CH_3)_4)IO_3$), tetramethylammonium perborate (($N(CH_3)_4)BO_3$), tetramethylammonium perchlorate (($N(CH_3)_4)ClO_4$), tetramethylammonium perbromate (($N(CH_3)_4)BrO_4$), tetramethylammonium periodate (($N(CH_3)_4)IO_4$), tetramethylammonium persulfate (($N(CH_3)_4)S_2O_8$), tetrabutylammonium peroxomonosulfate, peroxomonosulfuric acid, ferric compounds including chloride and/or nitrate, ferric urea hydrogen peroxide (($CO(NH_2)_2)H_2O_2$), peracetic acid ($CH_3(CO)OOH$), perphthalic acid, Fenton's reagents (peroxide+metal catalyst (e.g., Fe, Cu, Mn, or Co)+optionally glycine), and combinations thereof. The oxidizing agent may be introduced to the composition at the manufacturer, prior to introduction of the composition to the microelectronic device, or alternatively at the device wafer, i.e., in situ. It should be appreciated that when the oxidizing agent comprises a perborate, the perborate can be added as the borate species and the oxidizing agent. Preferably the oxidizing agent comprises hydrogen peroxide.

Borate compounds contemplated herein include, but are not limited to, sodium, potassium or ammonium salts of monoborate, diborate, triborate, tetraborate, pentaborate or hexaborate ions. Preferably the cation is metal ion-free (i.e., ammonium). In another embodiment, the borate compounds may comprise perborate species. Further, it is contemplated that the borate compound per se does not have to be added but instead the borate compound can be generated in situ.

In another embodiment, the cleaning compositions described herein further include residue, particles and/or organic and metal ion contaminants removed using said compositions. The residue, particles and/or organic and metal ion contaminant material may be dissolved and/or suspended in the cleaning compositions.

In addition to a liquid solution, it is also contemplated herein that the compositions described herein may be formulated as foams, fogs, subcritical or supercritical fluids (i.e., wherein the solvent is $CO_2$, etc., instead of water).

Advantageously, the cleaning compositions described herein effectively and selectively remove residue from the top surface, the sidewalls, and the vias and lines of the microelectronic device relative to the titanium nitride layers and low-k dielectric materials present on the device. In addition, the compositions may be used regardless of whether the trench or the via is etched first.

It will be appreciated that in general cleaning applications, it is common practice to make highly concentrated forms to be used at extreme dilutions. For example, the cleaning compositions may be manufactured in a more concentrated form, including at least about 20 wt % water for solubility purposes, and thereafter diluted with additional solvent (e.g., water) at the manufacturer, before use, and/or during use at the fab. Dilution ratios may be in a range from about 0.1 part diluent:1 part removal composition concentrate to about 10 parts diluent:1 part removal composition concentrate. In another embodiment, the oxidizing agent is combined with the other components at the manufacturer, before use and/or during use at the fab. It is understood that upon dilution or combination of components, the weight percent ratios of many of the components of the removal composition will remain unchanged.

The compositions described herein are easily formulated by simple addition of the respective ingredients and mixing to homogeneous condition. Furthermore, the compositions may be readily formulated as single-package formulations or multi-part formulations that are mixed at the point of use, preferably multi-part formulations. The individual parts of the multi-part formulation may be mixed at the tool or in a storage tank upstream of the tool. The concentrations of the respective ingredients may be widely varied in specific multiples of the composition, i.e., more dilute or more concentrated, and it will be appreciated that the compositions described herein can variously and alternatively comprise, consist or consist essentially of any combination of ingredients consistent with the disclosure herein. For example, the at least one amine and at least one borate compound in an aqueous solution may constitute one part of a multi-part formulation for combination with the at least one oxidizing agent at the fab or the point of use.

Accordingly, another aspect relates to a kit including, in one or more containers, one or more components adapted to form the compositions described herein. Preferably, the kit includes, in one or more containers, the preferred combination of at least one amine and at least one borate compound and optionally water, for combining with the at least one oxidizing agent and optionally water at the fab or the point of use. The containers of the kit must be suitable for storing and shipping said cleaning composition components, for example, NOWPak® containers (Advanced Technology Materials, Inc., Danbury, Conn., USA). The one or more containers which contain the components of the removal composition preferably include means for bringing the components in said one or more containers in fluid communication for blending and dispense. For example, referring to the NOWPak® containers, gas pressure may be applied to the outside of a liner in said one or more containers to cause at least a portion of the contents of the liner to be discharged and hence enable fluid communication for blending and dispense. Alternatively, gas pressure may be applied to the head space of a conventional pressurizable container or a pump may be used to enable fluid communication. In addition, the system preferably includes a dispensing port for dispensing the blended cleaning composition to a process tool.

Substantially chemically inert, impurity-free, flexible and resilient polymeric film materials, such as high density polyethylene, are preferably used to fabricate the liners for said one or more containers. Desirable liner materials are processed without requiring co-extrusion or barrier layers, and without any pigments, UV inhibitors, or processing agents that may adversely affect the purity requirements for components to be disposed in the liner. A listing of desirable liner materials include films comprising virgin (additive-free) polyethylene, virgin polytetrafluoroethylene (PTFE), polypropylene, polyurethane, polyvinylidene chloride, polyvinylchloride, polyacetal, polystyrene, polyacrylonitrile, polybutylene, and so on. Preferred thicknesses of such liner materials are in a range from about 5 mils (0.005 inch) to about 30 mils (0.030 inch), as for example a thickness of 20 mils (0.020inch).

Regarding the containers for the kits, the disclosures of the following patents and patent applications are hereby incorporated herein by reference in their respective entireties: U.S. Pat. No. 7,188,644 entitled "APPARATUS AND METHOD FOR MINIMIZING THE GENERATION OF PARTICLES IN ULTRAPURE LIQUIDS;" U.S. Pat. No. 6,698,619 entitled "RETURNABLE AND REUSABLE, BAG-IN-DRUM FLUID STORAGE AND DISPENSING CONTAINER SYSTEM;" and U.S. Patent Application Publication No. 20100128555 entitled "SYSTEMS AND METHODS FOR MATERIAL BLENDING AND DISTRIBUTION" published on May 27, 2010 in the name of John E. Q. Hughes, and PCT/US08/63276 entitled "SYSTEMS AND METHODS FOR MATERIAL BLENDING AND DISTRIBUTION" filed on May 9, 2008 in the name of Advanced Technology Materials, Inc.

As applied to microelectronic manufacturing operations, the cleaning compositions are usefully employed to clean residue from the surface of the microelectronic device, and may be applied to said surface before or after the application of other compositions formulated to remove alternative materials from the surface of the device.

In cleaning application, the composition may be applied in any suitable manner to the device to be cleaned, e.g., by spraying the composition on the surface of the device to be cleaned, by dipping the device to be cleaned in a static or dynamic volume of the composition, by contacting the device to be cleaned with another material, e.g., a pad, or fibrous sorbent applicator element, that has the composition absorbed thereon, or by any other suitable means, manner or technique by which the composition is brought into removal contact with the device to be cleaned. Further, batch or single wafer processing is contemplated herein.

In use of the compositions for removing residue, particles and/or organic and/or metal ion contaminants from microelectronic devices having same thereon, the composition typically is statically or dynamically contacted with the device for a time of from about 30 seconds to about 120 minutes, preferably about 1 minute to 60 minutes, at temperature in a range of from about 20° C. to about 70° C., preferably about 20° C. to about 50° C., and most preferably about 20° C. to about 40° C. Preferably, the contacting is static. Such contacting times and temperatures are illustrative, and any other suitable time and temperature conditions may be employed that are efficacious to at least partially remove the residue, particles and/or organic and/or metal ion contaminants from the device. "At least partial removal" of the residue, particles and/or organic and/or metal ion contaminants from the microelectronic device corresponds to at removal of at least 90% of the residue, particles and/or organic and/or metal ion contaminants, preferably at least 95% removal. Most preferably, at least 99% of said residue, particles and/or organic and/or metal ion contaminants is removed using the compositions described herein.

Following the achievement of the desired removal action, the compositions may be readily removed from the device to which it has previously been applied, e.g., by rinse, wash, or other removal step(s), as may be desired and efficacious in a given end use application of the compositions described herein. For example, the device may be rinsed with a rinse solution including deionized water and/or dried (e.g., spin-dry, $N_2$, vapor-dry etc.).

Another aspect relates to the improved microelectronic devices made according to the methods described herein and to products containing such microelectronic devices.

A still further aspect relates to methods of manufacturing an article comprising a microelectronic device, said method comprising contacting the microelectronic device with a composition for sufficient time to clean residue, particles and/or organic and/or metal ion contaminants from the microelectronic device having said residue thereon, and incorporating said microelectronic device into said article, wherein the composition includes at least one amine, at least one oxidizing agent, at least one borate compound, and water.

A still further aspect relates to methods of manufacturing an article comprising a microelectronic device, said method comprising contacting the microelectronic device with a composition for sufficient time to clean residue, particles and/or organic and/or metal ion contaminants from the microelectronic device having said materials thereon, and incorporating said microelectronic device into said article, wherein the composition includes at least one amine, at least one oxidizing agent, at least one borate compound, and water.

In yet another aspect, an article of manufacture is described, said article comprising a microelectronic device substrate, residue material, and a cleaning composition, wherein the cleaning composition may be any composition described herein, and wherein the residue material is selected from the group consisting of residue, particles, organic contaminants, metal ion contaminants, and combinations thereof.

The features and advantages of the invention are more fully shown by the illustrative examples discussed below.

EXAMPLE 1

A control SC-1 formulation was prepared including 1:1:40 (30% $H_2O_2$:30% $NH_4OH$:water). The SC-1 solution had a pH of 10.51. Formulations were prepared wherein 0.5 wt %, 1 wt % and 4 wt % ammonium tetraborate tetrahydrate (ATB, $(NH_4)_2B_4O_7 \cdot 4H_2O$) was added to the SC-1 formulation such that the ratio of $H_2O_2$:$NH_4OH$ remained the same by doing a 1:1 mass replacement of water. The reaction conditions included statically immersing a titanium nitride sample (coupon of a blanket stack having 130-150 Å TiN over $SiO_2$ on about 2000 Å of silicon substrate) in each formulation at temperature of about 24° C. for 0.5, 1, 2 and 10 minutes, a 120 second rinse in overflow deionized water, and analysis to determine the extent of TiN corrosion in the presence of each formulation.

Figure 1:
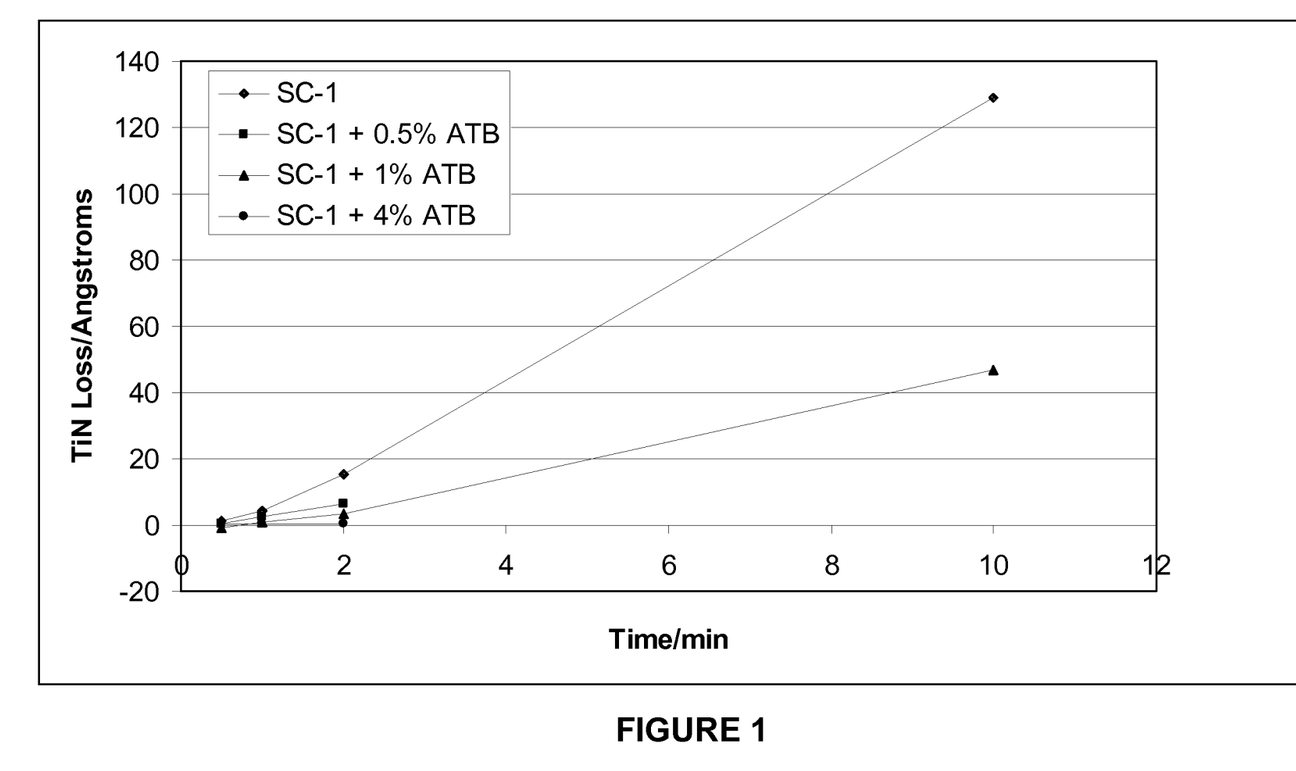
FIG. 1 illustrates the loss of titanium nitride in cleaning compositions having varying amounts of ammonium tetraborate tetrahydrate.

The results are illustrated in FIG. 1. It can be seen that the reduction of TiN loss at 10 minutes was about 66% when the 1% ATB was mixed with SC-1. Moveover, at 4% ATB, TiN loss appeared to have been eliminated for short exposure times.

The SC-1 composition including 4% ATB had a pH of 9.71. A new formulation including SC-1 and 4% ATB was made and the pH was adjusted to 10.42 with $NH_4OH$. The new formulation had a final ratio of $H_2O_2$:$NH_4OH$:4% ATB, aq of about 1:3.75:40. The reaction conditions included statically immersing a sample (2000-4000 Å PETEOS on a silicon substrate) in the three formulations at 25° C. for 10, 20, 30 and 60 minutes followed by a 60 second rinse and analysis to determine the extent of PETEOS removal. In addition, the reaction conditions included statically immersing a titanium nitride sample in the three formulations at temperature of about 20° C. for 1 and 10 minutes, a 60 second rinse in overflow deionized water, and analysis to determine the extent of TiN corrosion. The three formulations were the SC-1 formulation, the SC-1+4% ATB formulation (pH 9.71), and the SC-1+4% ATB formulation adjusted to pH 10.42.

Figure 2:
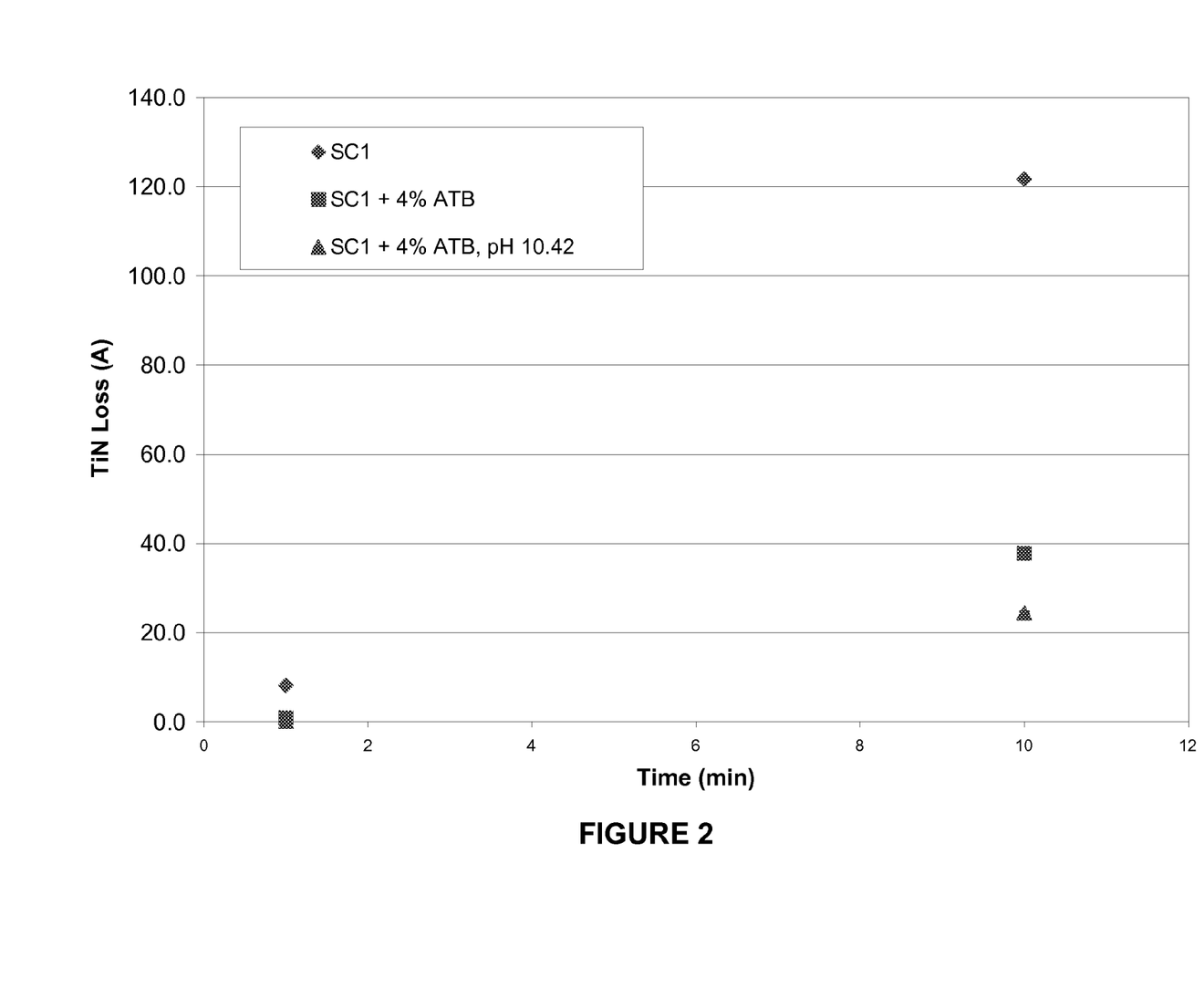
FIG. 2 illustrates the loss of titanium nitride in cleaning compositions having varying pH values.

It was determined that the formulation including 4% ATB adjusted to a pH of 10.42 further inhibited TiN corrosion, as shown in FIG. 2 whereby the $TiN_x$ loss decreased from 37.8 to 24.4 Å/min when the pH of the cleaning composition was adjusted from 9.71 to 10.42, respectively. With regards to PETEOS loss, about 6 Å of PETEOS was lost over the course of immersion in SC-1 for 60 minutes. Adding 4% ATB, with or without pH adjustment lowered the PETEOS loss over the same time to about 2 Å.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art, based on the disclosure herein. The invention therefore is to be broadly construed, as encompassing all such variations, modifications and alternative embodiments within the spirit and scope of the claims hereafter set forth.

What is claimed is:

1. A method of removing material from a microelectronic device having said material thereon, wherein the material comprises residue selected from the group consisting of post-ash residue, post-etch residue, post-CMP residue, and combinations thereof, said method comprising contacting the microelectronic device with a cleaning composition for sufficient time to at least partially remove said material from the microelectronic device, wherein the cleaning composition consists of at least one amine, at least one oxidizing agent, water, and at least one borate species, wherein the cleaning composition is substantially devoid of abrasive, wherein the pH is in a range from 9 to 11,
   wherein the at least one amine is selected from the group consisting of: ammonia; pyridine; 2-ethylpyridine; 2-methoxypyridine; 3-methoxypyridine; 2-picoline; dimethylpyridine; piperidine; piperazine; triethylamine; triethanolamine; aminoethylethanolamine; choline; N-methylaminoethanol; aminoethoxyethanol; dimethylaminoethoxyethanol; diethanolamine; N-methyldiethanolamine; ethylamine; methylamine; isobutylamine; Benzylamine; tert-butylamine; tributylamine; dipropylamine; dimethylamine; diglycolamine; monoethanolamine; pyrrole; isoxazole; 1,2,4-triazole; bipyridine; pyrimidine; pyrazine; pyridazine; quinoline; isoquinoline; indole; imidazole; N-methylmorpholine-N-oxide (NMMO); trimethylamine-N-oxide; triethylamine-N-oxide; pyridine-N-oxide; N-ethylmorpholine-N-oxide; N-methylpyrrolidine-N-oxide; N-ethylpyrrolidine-N-oxide; 1-methylimidazole; diisopropylamine; diisobutylamine; Dimethylamine; Ethanamine; Ethylamine; Ethylenediamine; 1-Hexanamine; 1,6-Hexanediamine; aniline; aniline derivatives; polyamines; and combinations thereof, and
   wherein the at least one oxidizing agent is selected from the group consisting of hydrogen peroxide ($H_2O_2$), $FeCl_3$ (both hydrated and unhydrated), oxone ($2KHSO_5.KHSO_4.K_2SO_4$), ozonated water, ammonium peroxomonosulfate, ammonium chlorite ($NH_4ClO_2$), ammonium bromite ($NH_4ClO_2$), ammonium chlorate ($NH_4ClO_3$), ammonium bromate ($NH_4BrO_3$), ammonium iodate ($NH_4IO_3$), ammonium perchlorate ($NH_4ClO_4$), ammonium perbromate ($NH_4BrO_4$), ammonium periodate ($NH_4IO_3$), ammonium persulfate (($NH_4)_2S_2O_8$), ammonium hypochlorite ($NH_4ClO$), ammonium hypobromite ($NH_4BrO$), sodium persulfate ($Na_2S_2O_8$), sodium hypochlorite (NaClO), sodium hypobromite (NaBrO), potassium iodate ($KIO_3$), potassium bromate ($KBrO_3$), potassium permanganate ($KMnO_4$), potassium persulfate, nitric acid ($HNO_3$), potassium persulfate ($K_2S_2O_8$), potassium hypochlorite (KClO), potassium hypobromite (KBrO), tetramethylammonium chlorite (($N(CH_3)_4)ClO_2$), tetramethylammonium bromite (($N(CH_3)_4)BrO_2$), tetramethylammonium chlorate (($N(CH_3)_4)ClO_3$), tetramethylammonium bromate (($N(CH_3)_4)BrO_3$), tetramethylammonium iodate (($N(CH_3)_4)IO_3$), tetramethylammonium perchlorate (($N(CH_3)_4)ClO_4$), tetramethylammonium perbromate (($N(CH_3)_4)BrO_4$), tetramethylammonium periodate (($N(CH_3)_4)IO_4$), tetramethylammonium persulfate (($N(CH_3)_4)S_2O_8$), tetrabutylammonium peroxomonosulfate, peroxomonosulfuric acid, ferric compounds including chloride and/or nitrate, urea hydrogen peroxide (($CO(NH_2)_2)H_2O_2$), peracetic acid ($CH_3(CO)OOH$), perphthalic acid, and combinations thereof.

2. The method of claim 1, wherein the cleaning composition comprises at least one amine, hydrogen peroxide, water, and at least one borate species.

3. The method of claim 1, wherein the cleaning composition comprises ammonia, hydrogen peroxide, water, and at least one borate species.

4. The method of claim 1, wherein the at least one amine comprises ammonia.

5. The method of claim 1, wherein the at least one oxidizing agent comprises hydrogen peroxide.

6. The method of claim 1, wherein the at least one borate species comprises a sodium, potassium or ammonium salt of monoborate, diborate, triborate, tetraborate, pentaborate, hexaborate, or perborate anion.

7. The method of claim 1, wherein the at least one borate species comprises an ammonium cation.

8. The method of claim 1, wherein the at least one borate species comprises ammonium tetraborate tetrahydrate.

9. The method of claim 1, wherein the at least one borate species is generated in situ.

10. The method of claim 1, wherein the cleaning composition comprises ammonia, hydrogen peroxide, ammonium tetraborate tetrahydrate, and water.

11. The method of claim 1, wherein the cleaning composition selectively removes the material from the microelectronic device relative to titanium nitride and low-k dielectric material.

12. The method of claim 1, wherein said contacting comprises conditions selected from the group consisting of: time of from about 0.5 minute to about 120 minutes; temperature in a range of from about 20° C. to about 70° C.; and combinations thereof.

13. The method of claim 1, further comprising rinsing the microelectronic device with deionized water following contact with the composition.

14. A method of removing material from a microelectronic device having said material thereon, wherein the material comprises residue selected from the group consisting of post-ash residue, post-etch residue, post-CMP residue, and combinations thereof, said method comprising contacting the microelectronic device with a cleaning composition for sufficient time to at least partially remove said material from the microelectronic device, wherein the cleaning composition comprises ammonia, hydrogen peroxide, water, and at least one borate species, wherein the cleaning composition is substantially devoid of abrasive, and wherein the pH is in a range from 9 to 11.

15. The method of claim 14, wherein the at least one borate species comprises ammonium tetraborate tetrahydrate.

16. A method of removing material from a microelectronic device having said material thereon, wherein the material comprises residue selected from the group consisting of post-ash residue, post-etch residue, post-CMP residue, and combinations thereof, said method comprising contacting the microelectronic device with a cleaning composition for sufficient time to at least partially remove said material from the microelectronic device, wherein the cleaning composition comprises ammonia, at least one oxidizing agent, water, and at least one borate species, wherein the cleaning composition is substantially devoid of abrasive, wherein the pH is in a range from 9 to 11, wherein the at least one oxidizing agent comprises a species selected from the group consisting of hydrogen peroxide ($H_2O_2$), $FeCl_3$ (both hydrated and unhydrated), oxone ($2KHSO_5 \cdot KHSO_4 \cdot K_2SO_4$), ozonated water, ammonium peroxomonosulfate, ammonium chlorite ($NH_4ClO_2$), ammonium bromite ($NH_4ClO_2$), ammonium chlorate ($NH_4ClO_3$), ammonium bromate ($NH_4BrO_3$), ammonium iodate ($NH_4IO_3$), ammonium perchlorate ($NH_4ClO_4$), ammonium perbromate ($NH_4BrO_4$), ammonium periodate ($NH_4IO_3$), ammonium persulfate (($NH_4)_2S_2O_8$), ammonium hypochlorite ($NH_4ClO$), ammonium hypobromite ($NH_4BrO$), sodium persulfate ($Na_2S_2O_8$), sodium hypochlorite (NaClO), sodium hypobromite (NaBrO), potassium iodate ($KIO_3$), potassium bromate ($KBrO_3$), potassium permanganate ($KMnO_4$), potassium persulfate, nitric acid ($HNO_3$), potassium persulfate ($K_2S_2O_8$), potassium hypochlorite (KClO), potassium hypobromite (KBrO), tetramethylammonium chlorite (($N(CH_3)_4)ClO_2$), tetramethylammonium bromite (($N(CH_3)_4)BrO_2$), tetramethylammonium chlorate (($N(CH_3)_4)ClO_3$), tetramethylammonium bromate (($N(CH_3)_4)BrO_3$), tetramethylammonium iodate (($N(CH_3)_4)IO_3$), tetramethylammonium perchlorate (($N(CH_3)_4)ClO_4$), tetramethylammonium perbromate (($N(CH_3)_4)BrO_4$), tetramethylammonium periodate (($N(CH_3)_4)IO_4$), tetramethylammonium persulfate (($N(CH_3)_4)S_2O_8$), tetrabutylammonium peroxomonosulfate, peroxomonosulfuric acid, ferric compounds including chloride and/or nitrate, urea hydrogen peroxide (($CO(NH_2)_2)H_2O_2$), peracetic acid ($CH_3(CO)OOH$), perphthalic acid, and combinations thereof.

17. A method of removing material from a microelectronic device having said material thereon, wherein the material comprises residue selected from the group consisting of post-ash residue, post-etch residue, post-CMP residue, and combinations thereof, said method comprising contacting the microelectronic device with a cleaning composition for sufficient time to at least partially remove said material from the microelectronic device, wherein the cleaning composition comprises at least one amine, at least one oxidizing agent, water, and ammonium tetraborate tetrahydrate, wherein the cleaning composition is substantially devoid of abrasive, wherein the pH is in a range from 9 to 11, wherein the at least one amine comprises at least one species selected from the group consisting of: ammonia; pyridine; 2-ethylpyridine; 2-methoxypyridine; 3-methoxypyridine; 2-picoline; dimethylpyridine; piperidine; piperazine; triethylamine; triethanolamine; aminoethylethanolamine; choline; N-methylaminoethanol; aminoethoxyethanol; dimethylaminoethoxyethanol; diethanolamine; N-methyldiethanolamine; ethylamine; methylamine; isobutylamine; Benzylamine; tert-butylamine; tributylamine; dipropylamine; dimethylamine; diglycolamine; monoethanolamine; pyrrole; isoxazole; 1,2,4-triazole; bipyridine; pyrimidine; pyrazine; pyridazine; quinoline; isoquinoline; indole; imidazole; N-methylmorpholine-N-oxide (NMMO); trimethylamine-N-oxide; triethylamine-N-oxide; pyridine-N-oxide; N-ethylmorpholine-N-oxide; N-methylpyrrolidine-N-oxide; N-ethylpyrrolidine-N-oxide; 1-methylimidazole; diisopropylamine; diisobutylamine; Dimethylamine; Ethanamine; Ethylamine; Ethylenediamine; 1-Hexanamine; 1,6-Hexanediamine; aniline; aniline derivatives; polyamines; benzyltrimethylammonium hydroxide; benzyltriethylammonium hydroxide; benzyltributylammonium hydroxide; dimethyldiethylammonium hydroxide; tetramethylammonium hydroxide; tetraethylammonium hydroxide; tetrapropylammonium hydroxide; tetrabutylammonium hydroxide; ammonium hydroxide; and combinations thereof, and wherein the at least one oxidizing agent comprises a species selected from the group consisting of hydrogen peroxide ($H_2O_2$), $FeCl_3$ (both hydrated and unhydrated), oxone ($2KHSO_5 \cdot KHSO_4 \cdot K_2SO_4$), ozonated water, ammonium peroxomonosulfate, ammonium chlorite ($NH_4ClO_2$), ammonium bromite ($NH_4ClO_2$), ammonium chlorate ($NH_4ClO_3$), ammonium bromate ($NH_4BrO_3$), ammonium iodate ($NH_4IO_3$), ammonium perchlorate ($NH_4ClO_4$), ammonium perbromate ($NH_4BrO_4$), ammonium periodate ($NH_4IO_3$), ammonium persulfate (($NH_4)_2S_2O_8$), ammonium hypochlorite ($NH_4ClO$), ammonium hypobromite ($NH_4BrO$), sodium persulfate ($Na_2S_2O_8$), sodium hypochlorite (NaClO), sodium hypobromite (NaBrO), potassium iodate ($KIO_3$), potassium bromate ($KBrO_3$), potassium permanganate ($KMnO_4$), potassium persulfate, nitric acid ($HNO_3$), potassium persulfate ($K_2S_2O_8$), potassium hypochlorite (KClO), potassium hypobromite (KBrO), tetramethylammonium chlorite (($N(CH_3)_4)ClO_2$), tetramethylammonium bromite (($N(CH_3)_4)BrO_2$), tetramethylammonium chlorate (($N(CH_3)_4)ClO_3$), tetramethylammonium bromate (($N(CH_3)_4)BrO_3$), tetramethylammonium iodate (($N(CH_3)_4)IO_3$), tetramethylammonium perchlorate (($N(CH_3)_4)ClO_4$), tetramethylammonium perbromate (($N(CH_3)_4)BrO_4$), tetramethylammonium periodate (($N(CH_3)_4)IO_4$), tetramethylammonium persulfate (($N(CH_3)_4)S_2O_8$), tetrabutylammonium peroxomonosulfate, peroxomonosulfuric acid, ferric compounds including chloride and/or nitrate, urea hydrogen peroxide (($CO(NH_2)_2)H_2O_2$), peracetic acid ($CH_3(CO)OOH$), perphthalic acid, and combinations thereof.

\* \* \* \* \*